(12) United States Patent
Ando et al.

(10) Patent No.: US 6,515,401 B1
(45) Date of Patent: Feb. 4, 2003

(54) PIEZOELECTRIC RESONATOR

(75) Inventors: Akira Ando, Omihachiman (JP); Masahiko Kimura, Kusatsu (JP); Takuya Sawada, Moriyama (JP); Jiro Inoue, Omihachiman (JP); Hiroaki Kaida, Moriyama (JP); Toru Nagae, Omihachiman (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/699,763

(22) Filed: Oct. 30, 2000

(30) Foreign Application Priority Data

Oct. 29, 1999 (JP) .............................. 11-308785
Oct. 24, 2000 (JP) ........................ 2000-323782

(51) Int. Cl.[7] .............................. H01L 41/04
(52) U.S. Cl. ........................................ 310/320
(58) Field of Search ................. 310/320, 365, 310/366

(56) References Cited

U.S. PATENT DOCUMENTS

| | | | | |
|---|---|---|---|---|
| 4,652,784 A | * | 3/1987 | Inoue et al. | ............... 310/320 |
| 4,894,580 A | * | 1/1990 | Ogawa | ....................... 310/320 |
| 4,900,970 A | * | 2/1990 | Ando et al. | ................. 310/320 |
| 4,939,403 A | * | 7/1990 | Kittaka et al. | .............. 310/320 |
| 5,084,647 A | * | 1/1992 | Inoue et al. | ................. 310/320 |
| 6,040,652 A | * | 3/2000 | Kaida | ......................... 310/320 |
| 6,198,200 B1 | * | 3/2001 | Kaida et al. | ................ 310/320 |
| 6,201,337 B1 | * | 3/2001 | Kaida et al. | ................ 310/321 |
| 6,229,246 B1 | * | 5/2001 | Kaida | ......................... 310/320 |

* cited by examiner

Primary Examiner—Nestor Ramirez
Assistant Examiner—Peter Medley
(74) Attorney, Agent, or Firm—Keating & Bennett, LLP

(57) ABSTRACT

A piezoelectric resonator which achieves a compact oscillator with high performance having high thermal resistance and a narrow tolerance includes an element body having an excitation layer and a non-excitation layer. One vibration electrode is provided on the surface of the excitation layer and another vibration electrode is provided between the excitation layer and the non-excitation layer. The two vibration electrodes extend from opposing ends of the excitation layer toward the approximate central portion thereof so as to oppose each other at the approximate central portion of the excitation layer. On end-surfaces of the element body, end-surface electrodes are connected to the vibration electrodes, respectively.

20 Claims, 10 Drawing Sheets

PIEZOELECTRIC RESONATOR

BACKGROUND OF THE INVENTION

1. Field of the Invention

The present invention relates to piezoelectric resonators, and in particular, the present invention relates to a piezoelectric resonator for use principally in oscillators.

2. Description of the Related Art

Conventionally, an energy trap type piezoelectric resonator has been included in oscillators which utilize a longitudinal thickness mode fundamental wave of a piezoelectric single-chip, the third longitudinal thickness mode harmonic of a piezoelectric single-chip, a shear mode vibration of a piezoelectric single-chip, or a longitudinal thickness mode harmonic of a monolithic piezoelectric body.

However, in a conventional resonator utilizing a longitudinal thickness mode fundamental wave, materials capable of trapping energy are limited. Thus, it is difficult to manufacture an energy trap type resonator using a material having high thermal resistance. Although a conventional shear mode resonator can use a material having high thermal resistance, handling of high frequency resonators during production is complicated due to a high speed of sound, and the mechanical reliability of the element itself is insufficient. Further, these resonators have a large electromechanical coefficient and cannot be used in applications requiring narrow tolerances.

Elements utilizing the third longitudinal thickness mode harmonic of a piezoelectric single-chip do not have these problems. However, the optimum electrode diameter of the energy trap type resonator is relatively large. Therefore, the size of these elements cannot be sufficiently reduced. Also, the element thickness is three times that of the fundamental wave type. Thus, the thickness of the element also cannot be sufficiently reduced. The resonators utilizing a longitudinal thickness mode harmonic of a monolithic piezoelectric body can be constituted by materials having high thermal resistance while the optimum electrode diameter of the energy trap type resonator is similar to that of the longitudinal thickness mode fundamental wave resonator. Therefore the size can be reduced. However, these resonators also have a large electromechanical coefficient, and thus cannot be used in applications requiring narrow tolerances. As described above, by conventional techniques, compact oscillators having high thermal resistance and a narrow tolerance have been very difficult to achieve.

Japanese Unexamined Patent Application Publication No. 5-48377 discloses a piezoelectric resonator using a deposited material composed of two layers of a paraelectric layer without piezoelectricity and a piezoelectric layer. In this piezoelectric resonator, because an electric field is applied to the piezoelectric layer and the paraelectric layer which are connected in series, the piezoelectric layer is not effectively vibrated, and the characteristics of the resonator are substantially altered because a capacitive component is inserted in series in an equivalent circuit.

SUMMARY OF THE INVENTION

To overcome the above-described problems, preferred embodiments of the present invention provide a piezoelectric resonator which achieves a compact oscillator with high performance having high thermal resistance and a narrow tolerance.

According to a preferred embodiment of the present invention, a piezoelectric resonator includes at least one pair of vibration electrodes, and an element body including at least one excitation layer sandwiched between the at least one pair of vibration electrodes and excited by an electric field so as to be vibrated, and at least one non-excitation layer not excited so as to be vibrated, the piezoelectric resonator exciting a longitudinal thickness mode harmonic of the n-th order (n is an integer other than 1), wherein when the thickness of the element body is denoted by t and a unit layer thickness is represented by approximately t/n, the thickness of the excitation layer is an integer multiple of the unit layer thickness and the thickness of the at least one non-excitation layer is an integer multiple of the unit layer thickness.

In such a piezoelectric resonator, it is preferable that the unit layer thickness of the excitation layer is in the range of about 0.7 t/n to about 1.2 t/n and the unit layer thickness of the non-excitation layer is in the range of about 0.8 t/n to about 1.3 t/n.

Also, the vibration electrodes are provided only on one principal plane of the non-excitation layer, or vibration electrodes having the same potential may be provided on both principal planes of the non-excitation layer.

Furthermore, the non-excitation layer is made of non-polarized piezoelectric ceramics or dielectric ceramics.

Such a piezoelectric resonator further includes a first and a second end surface electrode provided on the surface of the element body, a spurious response suppressing electrode electrically connected to the first end surface electrode, wherein the spurious response suppressing electrode is configured to have a constant gap at one end of the vibrating electrode connected to the second end surface at the other end in a direction that is substantially perpendicular to the depositing direction of the excitation layer and the non-excitation layer.

Preferably, a ratio between the gap and the unit layer thickness, i.e., gap/unit layer thickness, is in the range of about 1.0 to about 3.0.

By applying an electric field between vibration electrodes defined by sandwiching the excitation layer, the excitation layer is excited to be vibrated in a longitudinal thickness mode. At this time, since the electric field is not applied to the non-excitation layer or the non-excitation layer is made of a material which cannot be excited even when an electric field is applied thereto, the non-excitation layer is not excited to be vibrated. However, a standing wave is also transmitted to the non-excitation layer by the vibration of the excitation layer, so that the entirety becomes a piezoelectric resonator utilizing a longitudinal thickness mode harmonic of a higher order. That is, when the thickness of the element body is denoted by t and a unit layer thickness is represented by approximately t/n, by multiplying the thickness of an excitation layer and at least one of non-excitation layers by an integer multiple of the unit layer thickness t/n, a piezoelectric resonator utilizing a longitudinal thickness mode harmonic of the n-th order as the entirety is obtained.

Such a piezoelectric resonator uses a material having high thermal resistance and reduces the value of an electromechanical coefficient, such that a resonator having a narrow tolerance is achieved.

In such a piezoelectric resonator, when the unit layer thickness of the excitation layer is in the range of about 0.7 t/n to about 1.2 t/n and the unit layer thickness of the non-excitation layer is in the range of about 0.8 t/n to about 1.3 t/n, a piezoelectric resonator with excellent characteristics is obtained.

A non-excitation layer is configured so that an electric field cannot be applied thereto by constructing it such that it is not sandwiched by vibration electrodes.

Also, a non-excitation layer is not excited even when an electric field is applied thereto by using non-polarized piezoelectric ceramics or dielectric ceramics. In this case, of course, the electrodes may be arranged so that an electric field cannot be applied to the non-excitation layer.

Furthermore, by forming a spurious response suppressing electrode, vibrations in any mode other than a desired mode are greatly suppressed.

These effects are remarkable when a ratio gap/unit layer thickness is in the range of about 1.0 to about 3.0.

These and other objects, features, and advantages of the present invention will become more apparent from the following detailed description of embodiments according to the present invention taken in connection with the drawings.

DETAILED DESCRIPTION OF PREFERRED EMBODIMENTS

Figure 1:
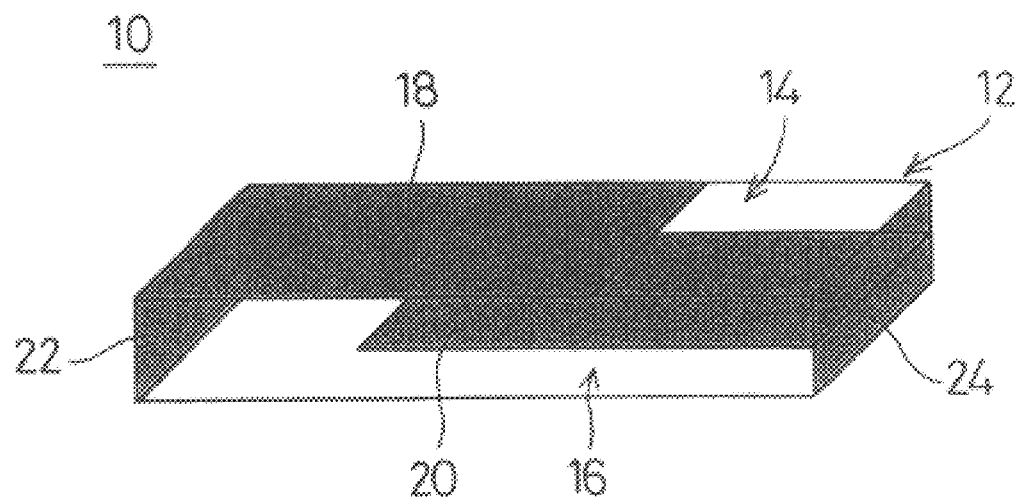
FIG. 1 is a schematic representation showing a preferred embodiment of a piezoelectric resonator according to the present invention.

FIG. 1 is a schematic representation showing a preferred embodiment of a piezoelectric resonator according to the present invention. A piezoelectric resonator 10 includes an element body 12 having an excitation layer 14 and a non-excitation layer 16. The non-excitation layer 16 is a layer which is not excited to vibrate, as will be described, when an electric field is applied to the piezoelectric resonator 10. The excitation layer 14 is polarized in the thickness direction. The element body 12 is configured such that the excitation layer 14 and the non-excitation layer 16 have approximately the same thickness. That is, when the thickness of the element body 12 is denoted by t, the respective thicknesses of the excitation layer 14 and the non-excitation layer 16 are about t/2.

On both surfaces of the excitation layer 14, vibration electrodes 18 and 20 are provided. The vibration electrode 18 is provided on the top surface of the excitation layer 14 while the vibration electrode 20 is provided between the excitation layer 14 and the non-excitation layer 16. The vibration electrode 18 extends from one end of the excitation layer 14 toward the central portion thereof while the other vibration electrode 20 extends from the other end of the excitation layer 14 toward the central portion thereof. At the central portion of the excitation layer 14, the two vibration electrodes 18 and 20 oppose each other. On both end surfaces of the element body 12, end-surface electrodes 22 and 24 are provided. The one end-surface electrode 22 is connected to the vibration electrode 18 on the top surface of the excitation layer 14 while the other end-surface electrode 24 is connected to the vibration electrode 20 between the excitation layer 14 and the non-excitation layer 16.

In the piezoelectric resonator 10, by applying a signal to the end-surface electrodes 22 and 24, an electric field is applied between the vibration electrodes 18 and 20 in the thickness direction of the excitation layer 14. Thereby, the excitation layer 14 is excited to vibrate in a longitudinal thickness mode. At this time, an electric field is not applied to the non-excitation layer 16, so that the non-excitation layer 16 is not excited to vibrate. However, since the excitation layer 14 is excited to vibrate in a longitudinal thickness mode, a standing wave is thereby transmitted also to the non-excitation layer 16, so that the entire structure becomes a piezoelectric resonator utilizing a longitudinal thickness mode harmonic of a higher order. The piezoelectric resonator 10 shown in FIG. 1 is configured such that the excitation layer 14 and the non-excitation layer 16, having approximately the same thickness, define a piezoelectric resonator utilizing the second longitudinal thickness mode harmonic. In the piezoelectric resonator 10, the vibration electrodes 18 and 20 oppose each other only in the central portion of the excitation layer 14, and an energy trap region is thereby provided therein to define an energy trap type piezoelectric resonator.

The piezoelectric resonator 10 includes a material having high thermal resistance for the material of the excitation layer 14 and reduces the value of an electromechanical coefficient. Thus, a resonator having a narrow tolerance is produced. Furthermore, by arranging the vibration electrodes 18 and 20 on both surfaces of the excitation layer 14, an electric field is applied only to the excitation layer 14, so that the piezoelectric resonator 10 is efficiently excited to vibrate in a longitudinal thickness mode. Also, in an equivalent circuit, a capacitive component is not connected in series with the excitation layer 14, thereby obtaining a resonator having stable characteristics.

Figure 2:
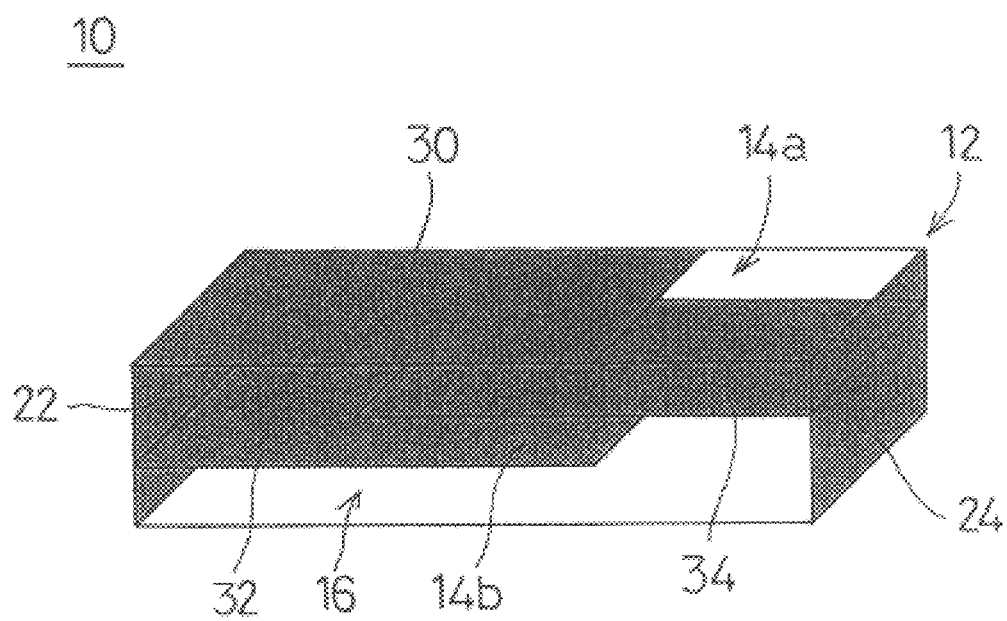
FIG. 2 is a schematic representation showing another preferred embodiment of a piezoelectric resonator according to the present invention.

As shown in FIG. 2, the piezoelectric resonator 10 is configured to be a piezoelectric resonator 10 utilizing the third longitudinal thickness mode harmonic by using a piezoelectric resonator including an element body 12 having two excitation layers 14a and 14b, and one non-excitation layer 16. In the piezoelectric resonator 10, on both sides of the excitation layers 14a and 14b, vibration electrodes 30 and 32 are provided and connected to the end-surface electrode 22. Between the two excitation layers 14a and 14b, another vibration electrode 34 is provided and connected to the end-surface electrode 24. In addition, on the external surface of the non-excitation layer 16, a vibration electrode is not provided, so that the non-excitation layer 16 is arranged to not be excited by an electric field. When the thickness of the element body 12 is denoted by t, the thicknesses of the excitation layers 14a and 14b, and the non-excitation layer 16 are respectively about t/3.

In such a piezoelectric resonator 10, an electric field is applied to the excitation layers 14a and 14b, which in turn are excited to vibrate in a longitudinal thickness mode. At this time, a standing wave is also transmitted to the non-excitation layer 16, so that the entire structure defines a piezoelectric resonator utilizing the third longitudinal thickness mode harmonic.

Figure 3:
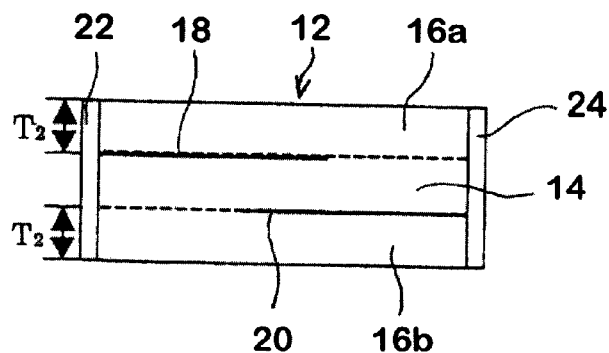
FIG. 3 is a schematic representation showing another preferred embodiment of a piezoelectric resonator according to the present invention.

Furthermore, as shown in FIG. 3, an element body 12 including an excitation layer 14 having non-excitation layers 16a and 16b respectively provided on both surfaces thereof is used. In this case, when the thickness of the element body 12 is denoted by t, the excitation layer 14 has a thickness of t/3, and the thickness $T_2$ of each of the two non-excitation layers 16a and 16b has a thickness of t/3. On both sides of the excitation layer 14 in the approximate center, the vibration electrodes 18 and 20 are provided and connected to the end-surface electrodes 22 and 24, respectively. Also, in such a piezoelectric resonator 10, an electric field is applied to the excitation layer 14, which are excited to vibrate in a longitudinal thickness mode, and a standing wave is transmitted to the non-excitation layers 16a and 16b provided on the both sides of the excitation layer 14, so that the entire structure becomes a piezoelectric resonator utilizing the third longitudinal thickness mode harmonic.

Figure 4:
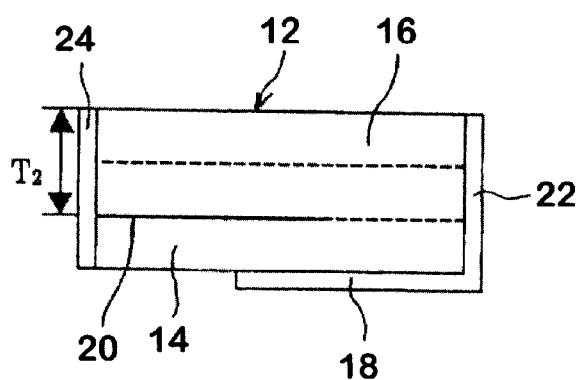
FIG. 4 is a schematic representation showing another preferred embodiment of a piezoelectric resonator according to the present invention.

Furthermore, as shown in FIG. 4, in the piezoelectric resonator 10 using the element body 12 including the excitation layer 14 and the non-excitation layer 16, when the thickness of the element body 12 is denoted by t, the thickness of the excitation layer 14 is about t/3 and the thickness $T_2$ of the non-excitation layer 16 is about 2t/3. In this case, when the excitation layer 14 is excited to vibrate in a longitudinal thickness mode, a standing wave is transmitted to the non-excitation layer having twice the thickness of the excitation layer 14, so that the entire structure becomes a piezoelectric resonator utilizing the third longitudinal thickness mode harmonic.

Figure 5:
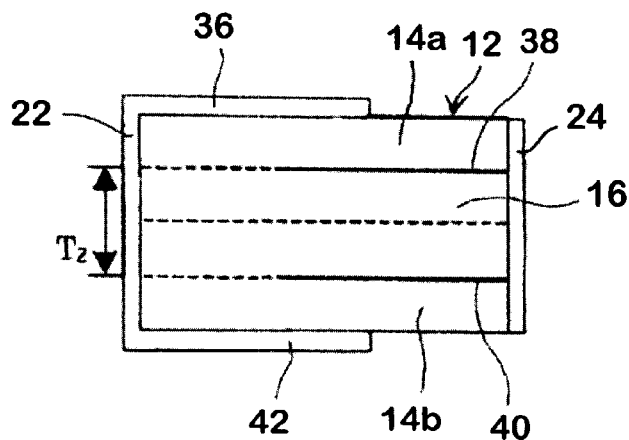
FIG. 5 is a schematic representation showing another preferred embodiment of a piezoelectric resonator according to the present invention.

Also, as shown in FIG. 5, the piezoelectric resonator 10 includes an element body 12, in the approximate center of which the non-excitation layer 16 having excitation layers 14a and 14b provided on both surfaces thereof is provided. In this piezoelectric resonator 10, when the thickness of the element body 12 is denoted by t, the excitation layers 14a and 14b are configured to have the respective thicknesses of approximately t/4 and the thickness $T_2$ of the non-excitation layer 16 is configured to have the thickness of about t/2. On both sides of the excitation layer 14a, vibrating electrodes 36 and 38 are provided while on both sides of the excitation layer 14b, vibrating electrodes 40 and 42 are provided. The vibrating electrodes 36 and 42 provided on the external surfaces of the element body 12 are connected to the end-surface electrode 22 while the vibrating electrodes 38 and 40 provided on the internal portions of the element body 12 are connected to the end surface electrode 24.

In such a piezoelectric resonator 10, an electric field is applied to the excitation layers 14a and 14b on both sides of the element body 12, which in turn are excited to vibrate in a longitudinal thickness mode. However, since the vibrating electrodes 38 and 40 on both sides of the non-excitation layer 16 are connected to the same end surface electrode 24, an electric field is not applied to the non-excitation layer 16 so as not to be excited to vibrate. A standing wave is transmitted to the non-excitation layer 16 having about twice the thickness of each of the excitation layers 14a and 14b, so that the entire structure becomes a piezoelectric resonator utilizing the fourth longitudinal thickness mode harmonic.

As described above, when the thickness of the element body 12 is denoted by t and a unit layer thickness is represented by t/n, by multiplying the thickness of an excitation layer and a non-excitation layer by an integer multiple of t/n, a piezoelectric resonator utilizing a longitudinal thickness mode harmonic of the n-th order as the entire unit is obtained. In addition, in each of the above-mentioned piezoelectric resonators 10, a non-excitation layer provided therein does not have an electric field applied thereto. However, alternatively, a non-excitation layer can be obtained in which an electric field is applied by forming the layer of non-polarized piezoelectric ceramics or dielectric ceramics.

Figure 6:
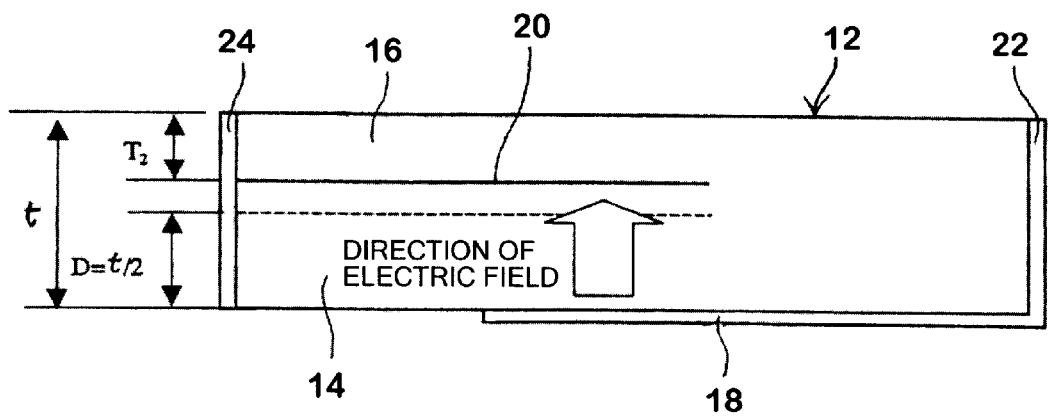
FIG. 6 is a schematic representation showing a state that thicknesses of an excitation layer and a non-excitation layer are changed in the piezoelectric resonator according to a preferred embodiment of the present invention.

In addition, when the thickness of the element body 12 is denoted by t, thicknesses of the excitation layer and the non-excitation layer are not required to be precisely t/n. For example, as shown in FIG. 6, in the piezoelectric resonator 10 utilizing the second longitudinal thickness mode harmonic, the thickness of the excitation layer 14 may be greater than the thickness $T_2$ of the non-excitation layer 16. Conversely, the thickness of the excitation layer 14 may be less than the thickness $T_2$ Of the non-excitation layer 16. From an experimental result, it is understood that a piezoelectric resonator having excellent characteristics is obtained when the excitation layer 14 has a thickness in the range of about 0.7 t/n–1 to about 1.2 t/n and the non-excitation layer 16 has the thickness in the range of about 0.8 t/n–1 to about 1.3 t/n, if the thickness of the element body 12 is denoted by t.

Figure 7:
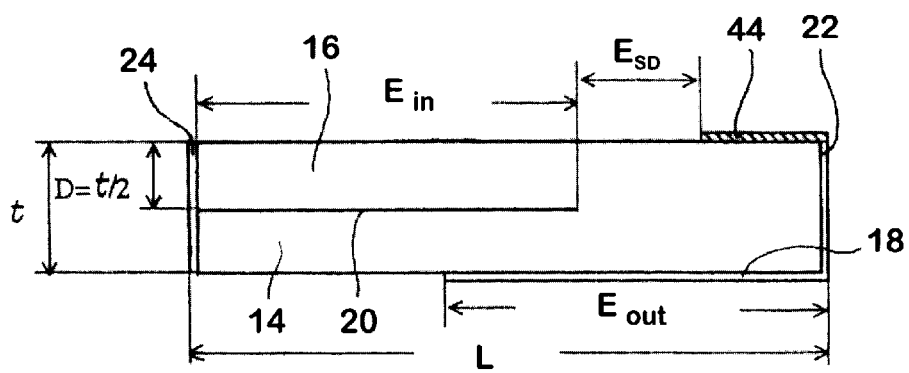
FIG. 7 is a schematic representation showing an example of a piezoelectric resonator having a spurious response suppressing electrode provided therein.

Furthermore, as shown in FIG. 7, by providing a spurious response suppressing electrode, a spurious output is greatly suppressed. In the piezoelectric resonator 10, a spurious response suppressing electrode 44 is provided on the external surface of the non-excitation layer 16 so as to be connected to the end surface electrode 22. The spurious response suppressing electrode 44 extends in a direction that is substantially perpendicular to the depositing direction of the excitation layer 14 and the non-excitation layer 16 and spaced from the internal vibration electrode 20 connected to the end surface electrode 24. In such a manner, by providing the spurious response suppressing electrode 44, a spurious output is greatly suppressed. According to an experimental result, such an effect is substantial when the value of $E_{sd}/D$ is in the range of about 1.0 to about 3.0, wherein $E_{sd}$ represents a gap between the vibration electrode 20 and the spurious response suppressing electrode 44, and D is a unit layer thickness indicating ½ of the thickness t of the element body 12.

As the piezoelectric resonator 10 shown in FIG. 7 is a piezoelectric resonator utilizing the second longitudinal thickness mode harmonic, D is ½ of the thickness t of the element body 12. In general, when the piezoelectric resonator is a piezoelectric resonator utilizing a longitudinal thickness mode harmonic of the n-th order, when the thickness of the element body 12 is denoted by t, D is a unit layer thickness indicated by t/D. When a ratio between the gap $E_{sd}$ and the unit layer thickness D is in the range of about 1.0 to about 3.0, the spurious suppressing effect becomes noticeable.

Figure 8:
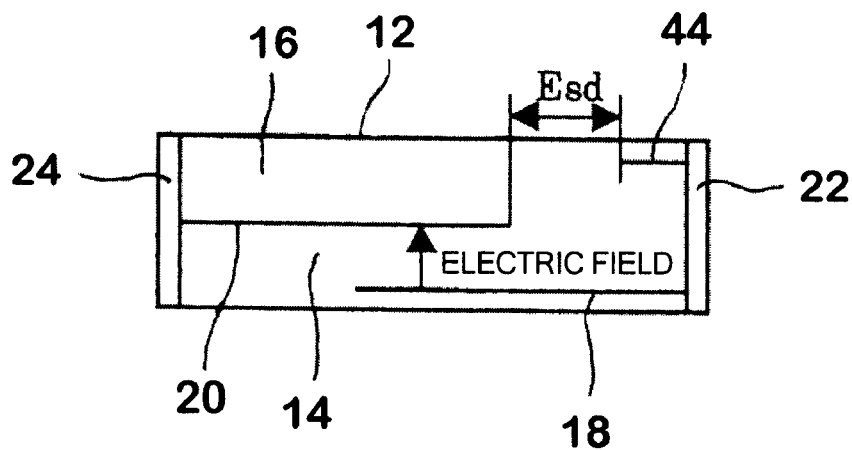
FIG. 8 is a schematic representation showing another example of a piezoelectric resonator having a spurious response suppressing electrode provided therein.
Figure 9:
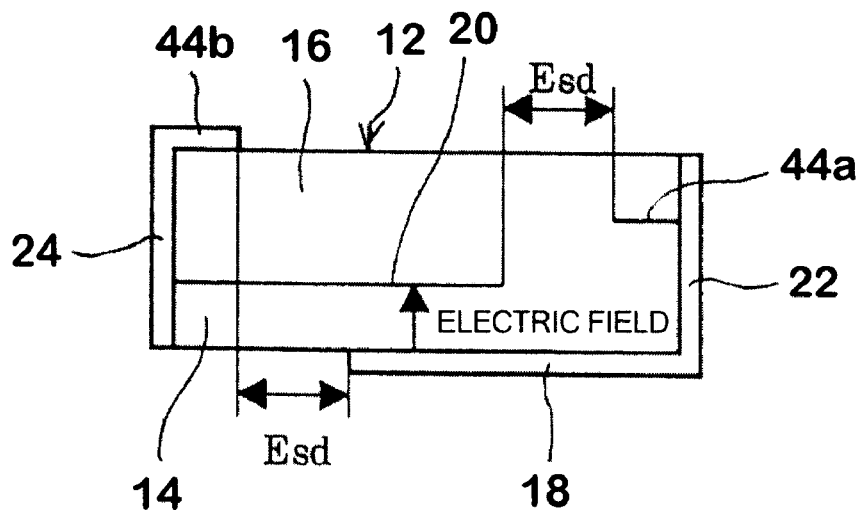
FIG. 9 is a schematic representation showing another preferred embodiment of a piezoelectric resonator having spurious response suppressing electrodes provided therein.

As a piezoelectric resonator 10 utilizing the second longitudinal thickness mode harmonic having the spurious response suppressing electrode 44 provided therein, as shown in FIG. 8, may also be configured such that the vibration electrodes 18 and 20, and the spurious response suppressing electrode 44 are not exposed outside the surface of the element body 12. Also, as shown in FIG. 9, a spurious response suppressing electrode is provided on a piezoelectric resonator utilizing the third longitudinal thickness mode harmonic with the non-excitation layer 16 having twice the thickness of the excitation layer 14. In the piezoelectric resonator 10 shown in FIG. 9, a spurious response suppressing electrode 44a is provided in an intermediate portion of the thickness direction of the non-excitation layer 16 and another spurious response suppressing electrode 44b is provided on the surface of the non-excitation layer 16. A gap $E_{sd}$ is provided between the spurious response suppressing electrode 44a and the internal vibration electrode 20 while a gap $E_{sd}$ is provided between the spurious response suppressing electrode 44b and the external vibration electrode 18. In such a manner, by providing a spurious response suppressing electrode 44, a spurious output is greatly suppressed not only in a piezoelectric resonator utilizing the second longitudinal thickness mode harmonic but also in a piezoelectric resonator utilizing a longitudinal thickness mode harmonic of the n-th order.

EXAMPLES

Example 1

First, lead oxide, titanium dioxide, lanthan oxide, and manganese carbonate were prepared so that a molar ratio between Pb:La:Ti:Mn is to be 0.865:0.090:1.000: 0.020; they were stirred to be mixed for about ten hours in a ball mill together with water and a grinding media of partially stabilized zirconia; after dehydration, the mixture was calcined in the atmosphere at a temperature of 800 to 1000° C. for about two hours. Slurry for forming sheets was produced by mixing a vinyl acetate binder into the obtained calcined material in a ratio that 10 g of the reduced solid of the binder, 30 g of water, and a proper quantity of a plasticizer were added to 100 g of the calcined material.

Figure 10:
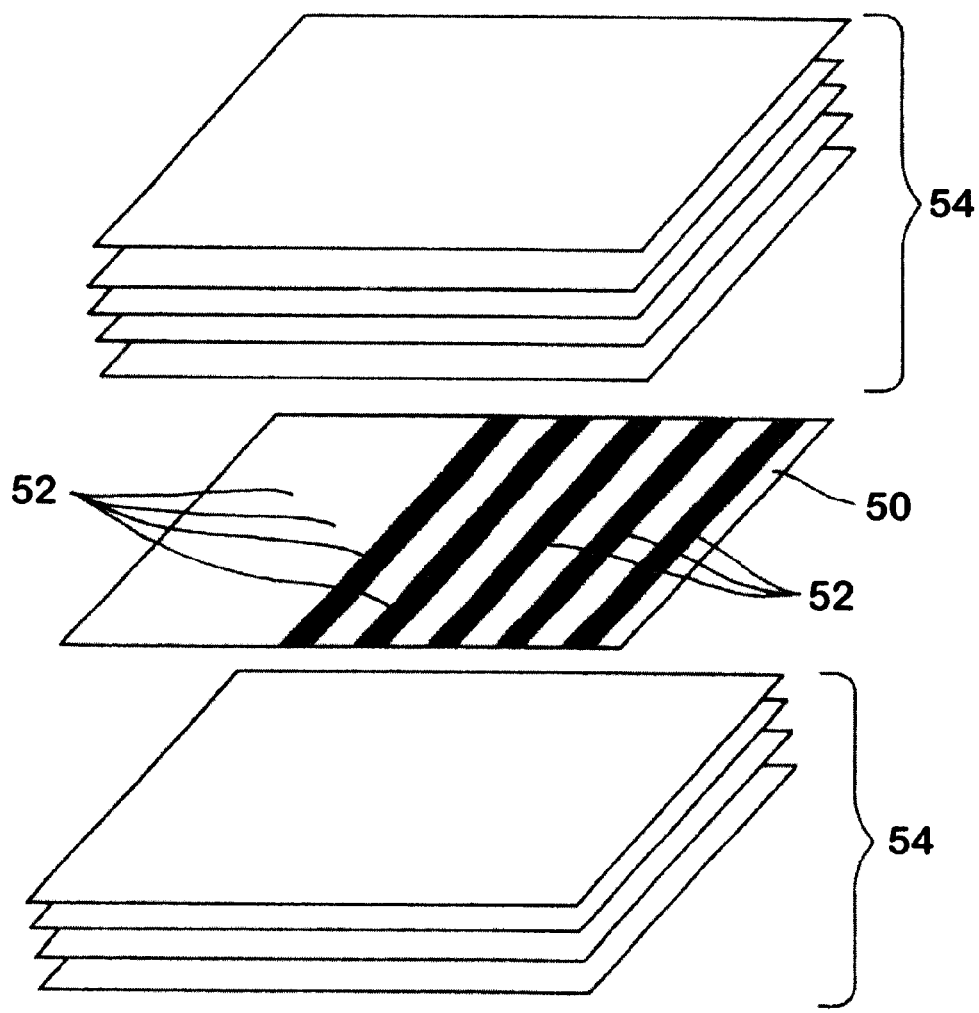
FIG. 10 is a schematic representation showing a portion of a process for manufacturing the piezoelectric resonator shown in FIG. 1.

A sheet having a thickness of approximately 50 μm was formed by a doctor blade method from the slurry; the formed sheet was cut into a size of 20 mm×30 mm; as shown in FIG. 10, an electrode pattern 52 was screen-printed on a portion of a sheet 50 in a parallel lines pattern; the screen mesh used was #400; an electrode material was platinum; a paste for printing was the mixture of platinum and an varnish, including 50 to 70 wt % of platinum; as shown in FIG. 10, sheets 54 having no electrode pattern provided thereon were laid up on both surfaces of a sheet 50 having an electrode pattern 52 provided thereon to be pressed under a pressure of 100 to 200 MPa; and the obtained pressed product was burned at 1200° C. for about two hours to obtain a sintered body 58 having an electrode 56 internally provided therein.

Figure 11:
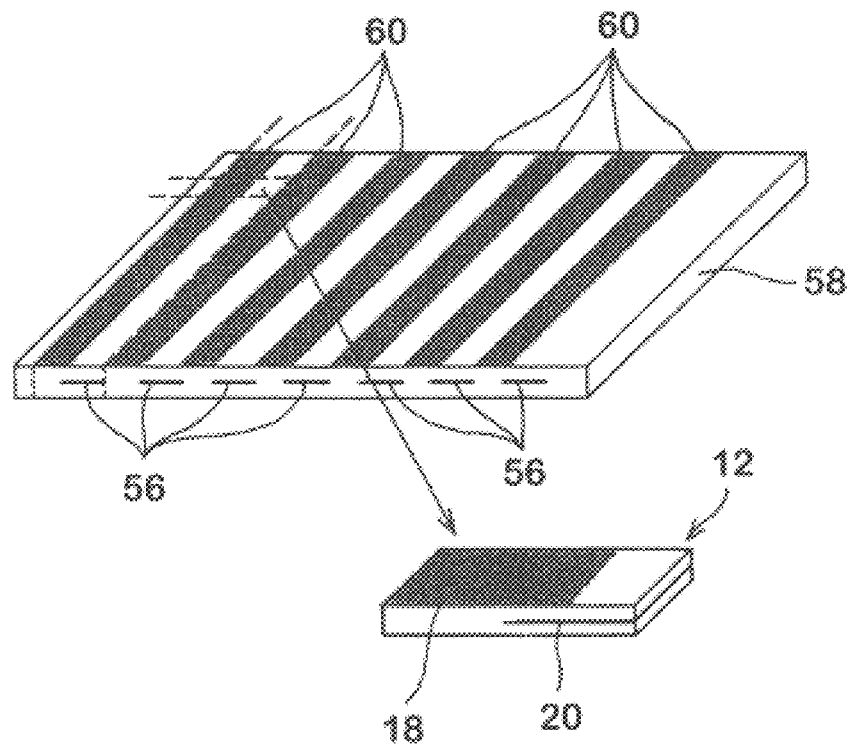
FIG. 11 is a schematic representation for showing a sintered body produced in the process shown in FIG. 10.

Silver electrodes were formed on both surfaces over the entire surfaces of the obtained sintered body 58 by vapor deposition; then the sintered body 58 was polarized in oil at a temperature of 100 to 150° C. by applying an electric field of 5 to 10 MV/m; then after holding the sample in air at a temperature of 100 to 250° C. for one hour, the vapor-deposited silver electrodes were patterned by etching; the patterned silver electrodes 60, as shown in FIG. 11, were arranged to be parallel to each other and to be opposed partially to the electrode 56 provided inside the sintered body; as shown by the dotted lines in FIG. 11, the sintered body was cut so that the electrodes 56 provided inside the sintered body and the electrodes 60 provided on the surface of the sintered body 58 were exposed on opposing end-surfaces so as to obtain the element body 12 having electrodes 18 and 20 provided thereon; on the side surfaces of the element body 12, end-surface electrodes 22 and 24 were provided to be connected to the electrodes 18 and 20 exposed on the opposing end-surfaces; in such a manner, the piezoelectric resonator shown in FIG. 1 was produced.

Figure 12:
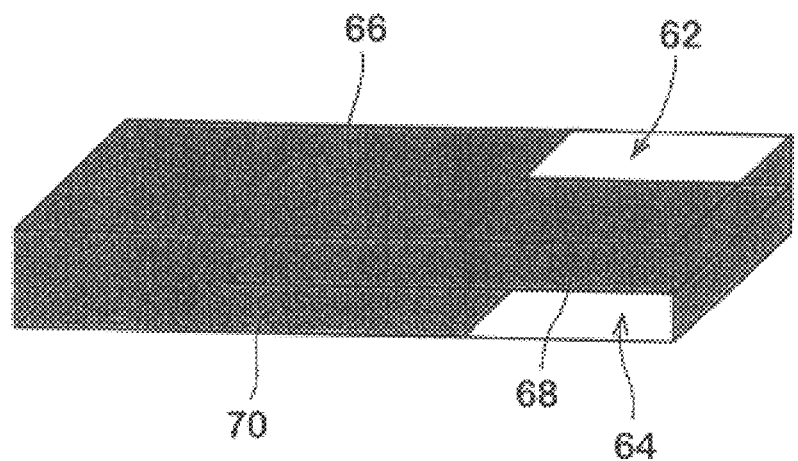
FIG. 12 is a schematic representation for showing an example of a conventional piezoelectric resonator as a comparative sample.
Figure 13:
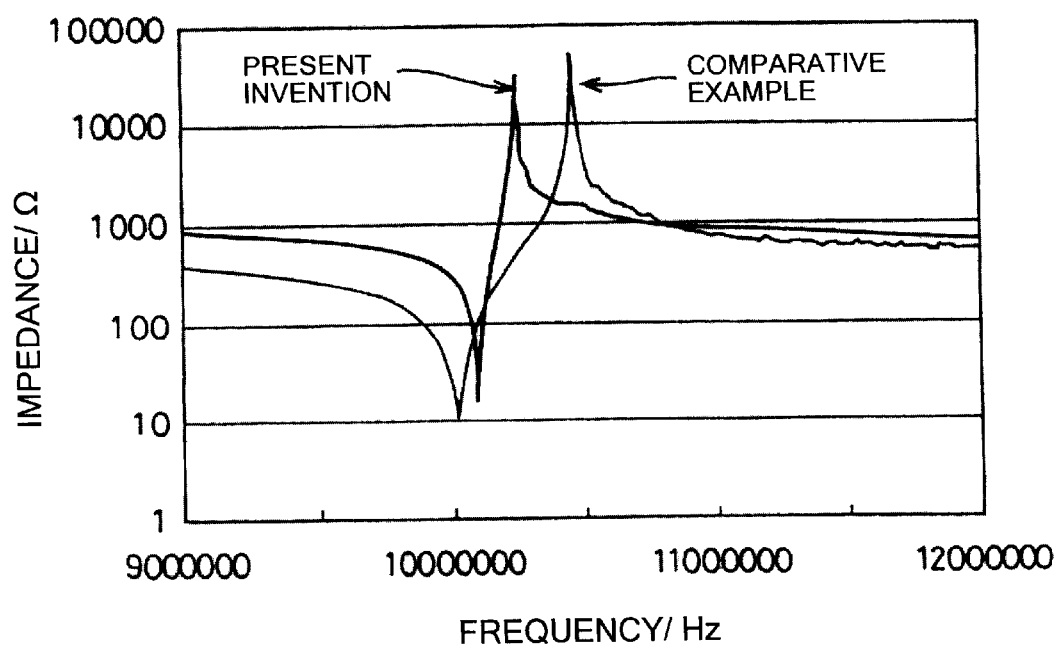
FIG. 13 is a graph showing frequency characteristics of the impedance of the piezoelectric resonator according to a preferred embodiment of the present invention shown in FIG. 1 and the conventional piezoelectric resonator shown in FIG. 12.

As to the resulting piezoelectric resonator 10, frequency characteristics of impedance were measured. As a comparative example, about a conventional piezoelectric resonator having electrodes 66, 68, and 70 provided thereon and respectively opposing two excitation layers 62 and 64 as shown in FIG. 12, frequency characteristics of the impedance were measured. The obtained result is shown in FIG. 13. It is understood from FIG. 13 that in the piezoelectric resonator 10 according to preferred embodiments of the present invention, resonance characteristics with a narrower bandwidth compared with that of the conventional piezoelectric resonator were obtained. In addition, the piezoelectric resonator 10 according to the preferred embodiment excites the second longitudinal thickness mode harmonic.

Example 2

Figure 14:
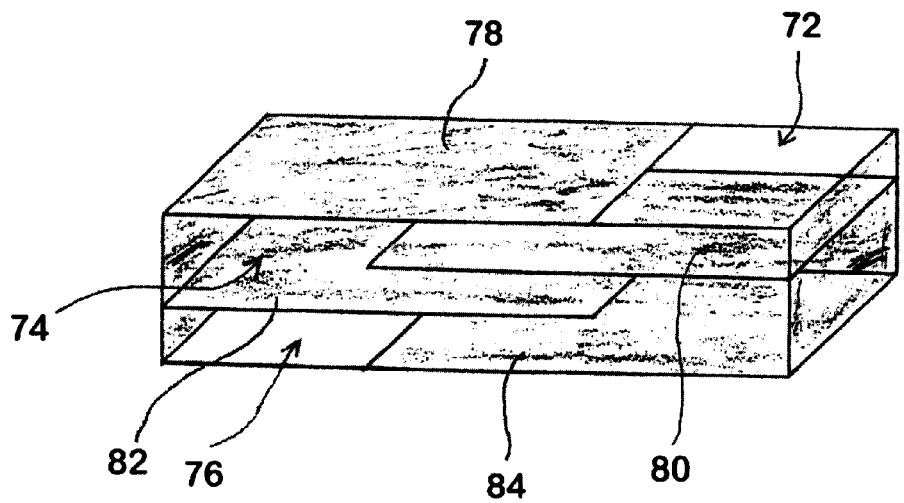
FIG. 14 is a schematic representation for showing a conventional piezoelectric resonator used as a comparative example with the piezoelectric resonator shown in FIG. 2.
Figure 15:
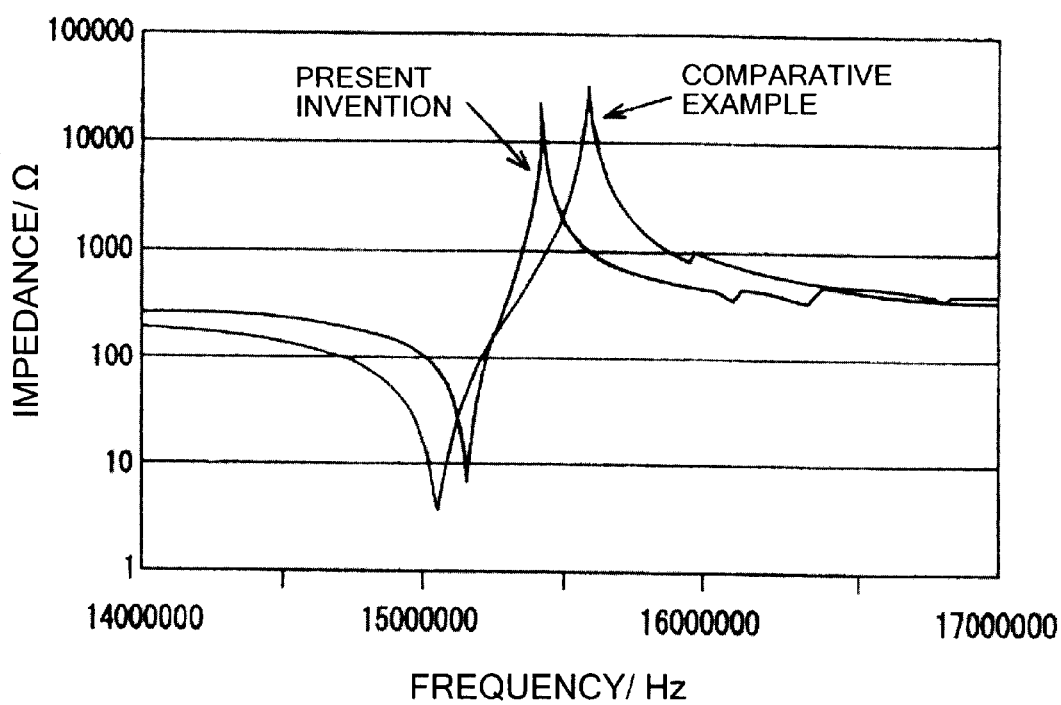
FIG. 15 is a graph showing frequency characteristics of the impedance of the piezoelectric resonator according to the preferred embodiment of the present invention shown in FIG. 2 and the conventional piezoelectric resonator shown in FIG. 14.

As shown in FIG. 2, a piezoelectric resonator 10 was produced, which includes two excitation layers and one non-excitation layer, and excites the third longitudinal thickness mode harmonic. As to the obtained piezoelectric resonator 10, frequency characteristics of the impedance were measured. As a comparative example, about a conventional piezoelectric resonator having electrodes 78, 80, 82, and 84 provided thereon and respectively opposing three excitation layers 72, 74, and 76 as shown in FIG. 14, frequency characteristics of the impedance were measured. The obtained result is shown in FIG. 15. It is understood from FIG. 15 that in the piezoelectric resonator 10 according to preferred embodiments of the present invention, resonance characteristics with a narrower bandwidth compared with that of the conventional piezoelectric resonator were obtained.

Example 3

Figure 16:
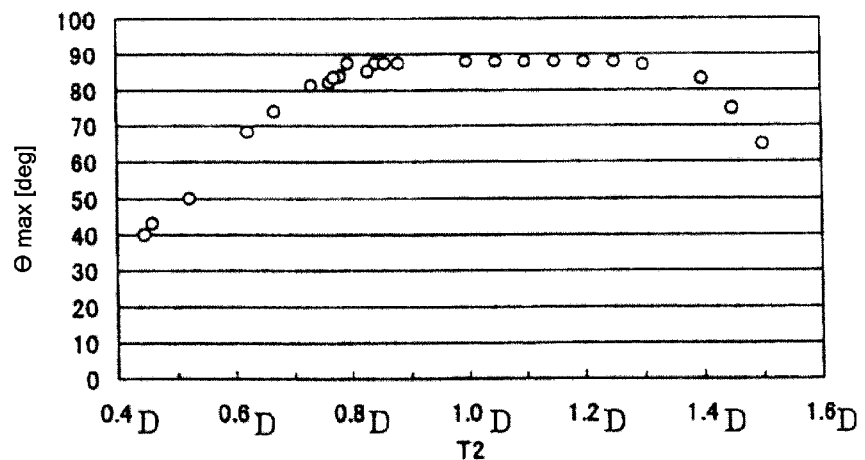
FIG. 16 is a graph for showing the relationship between the thickness of the non-excitation layer and the value $\theta_{max}$ of the piezoelectric resonator shown in FIG. 6.

As shown in FIG. 6, a piezoelectric resonator 10 utilizing the second longitudinal thickness mode harmonic was formed by changing thicknesses of the excitation layer 14 and the non-excitation layer 16. Then the relationship between the thickness $T_2$ of the non-excitation layer 16 and the maximum value $\theta_{max}$ of phase characteristics of the piezoelectric resonator 10 was measured, and the result thereof is shown in FIG. 16. As understood from FIG. 16, if the thickness of the element body 12 is denoted by t, and D=t/2, the value of $\theta_{max}$ is large indicating excellent characteristics when T2 is in the 0.8D to 1.3D range, that is the thickness of the excitation layer 14 is in the 0.7D to 1.2D.

Example 4

Figure 17:
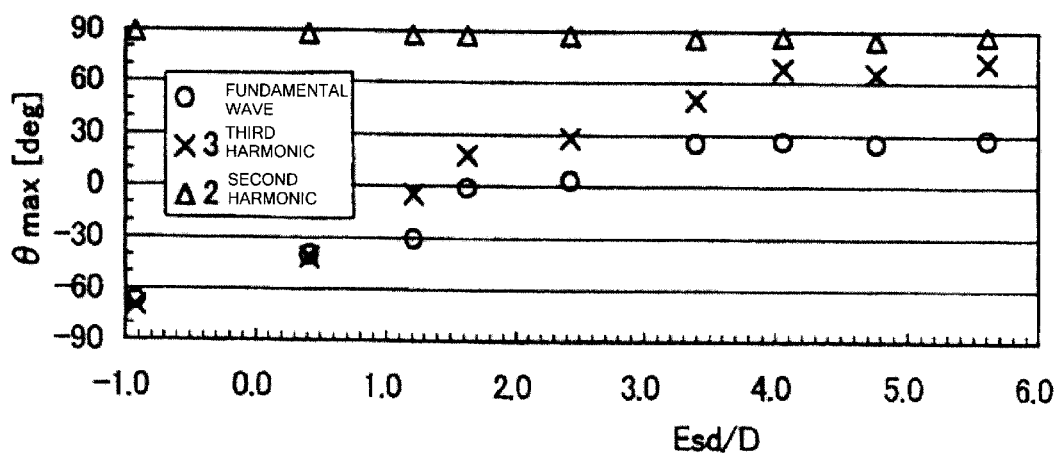
FIG. 17 is a graph showing the relationship between the value $E_{sd}/D$ and the value $\theta_{max}$ about a fundamental wave, the second harmonic, and the third harmonic excited in the piezoelectric resonator shown in FIG. 7.

As shown in FIG. 7, a piezoelectric resonator 10 including the spurious response suppressing electrode 44 and utilizing the second longitudinal thickness mode harmonic was formed. In addition, in the piezoelectric resonator 10 shown in FIG. 7, the thickness of the element body 12 was t =0.245 mm, the length of the element body 12 was L=2.2 mm, and the lengths of the vibration electrodes 18 and 20 were: Ein=1.35 mm, Eout=1.35 mm, respectively. Then the relationship between a ratio $E_{sd}/D$ of the gap $E_{sd}$ and the unit layer thickness D and the value $\theta_{max}$ was measured, and the result thereof is shown in FIG. 17. In FIG. 17, values $\theta_{max}$ of the second harmonic excited by the piezoelectric resonator 10, a fundamental wave which is a spurious signal, and the third harmonic are shown. As understood from FIG. 17, when the value $E_{sd}/D$ is equal to or less than about 3.0, the values $\theta_{max}$ of the fundamental wave which is the spurious signal and the third harmonic are small, the value $\theta_{max}$ of the second harmonic is large.

Figure 18:
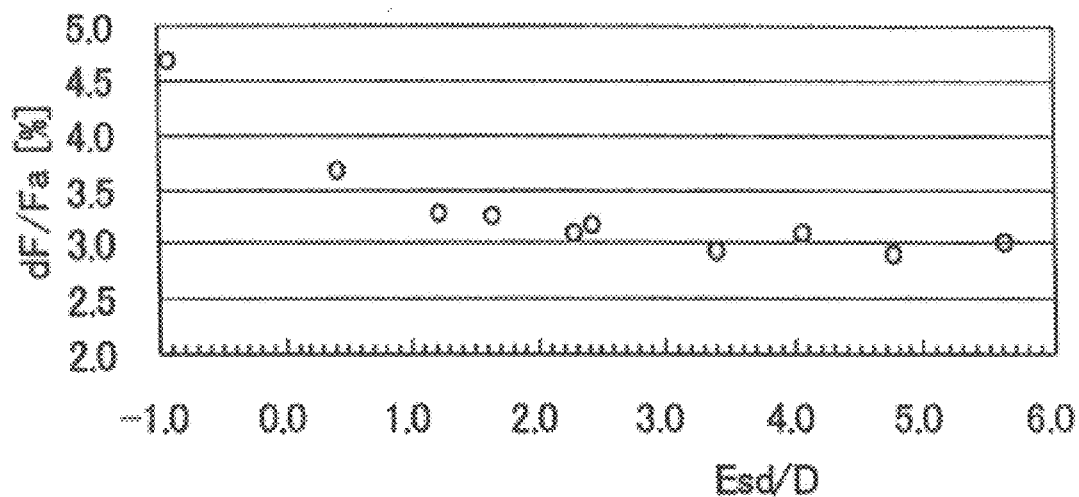
FIG. 18 is a graph showing the relationship between the value dF/Fa and the value $E_{sd}/D$ of the piezoelectric resonator shown in FIG. 7.

Furthermore, in the piezoelectric resonator 10 shown in FIG. 7, the relationship between the relative bandwidth dF/Fa and $E_{sd}/D$ was measured, and the result thereof is shown in FIG. 18. As understood from FIG. 18, when $E_{sd}/D$ is at least about 1.0, a narrow bandwidth region was obtained. In such a piezoelectric resonator 10, a narrow bandwidth region is desired, so that it is preferable that $E_{sd}/D$ be at least about 1.0. Accordingly, from FIGS. 17 and 18, it is preferable that $E_{sd}/D$ be in the range of about 1.0 to 3.0.

Figure 19:
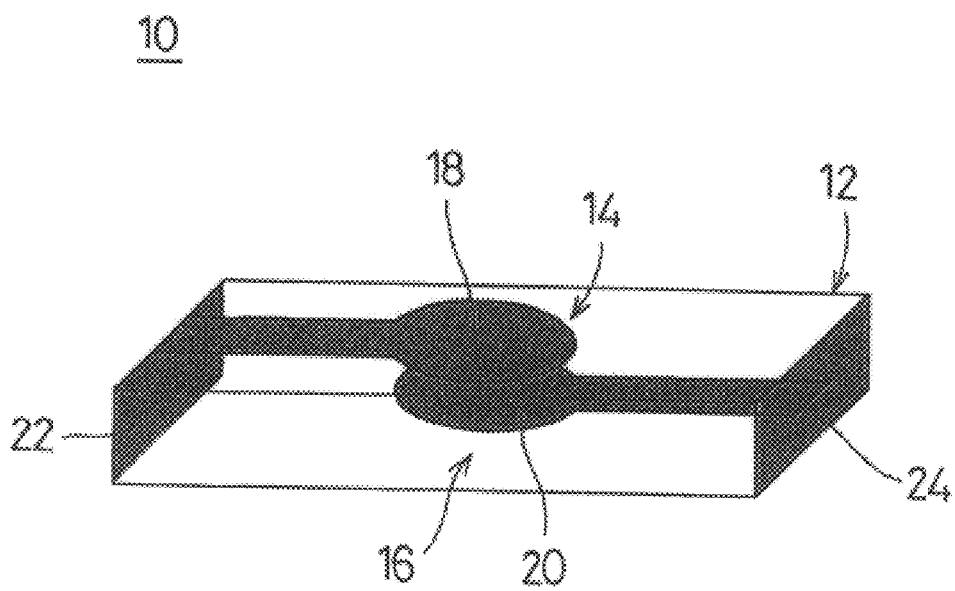
FIG. 19 is a schematic representation showing an example in which the shape of a vibration electrode is changed in the piezoelectric resonator according to a preferred embodiment of the present invention.

As described above, the piezoelectric resonator 10 according to preferred embodiments of the present invention may excite any order of a longitudinal thickness mode harmonic. As a shape of the vibration electrodes 18 and 20 for forming an energy-trap region, it may be substantially circular as shown in FIG. 19, substantially oval, or a shape connecting any of these shapes to a substantially rectangular shape.

As a material of the excitation layer 14, as long as it is a piezoelectric body, any materials may be used; even when a Poisson's ratio is at least about ⅓, or less than about ⅓, energy trap is achieved. As a material of the excitation layer of a unitarily sintering structure, ceramic materials are generally used. As these materials, lead titanate, lead titanate zirconate, barium titanate, tungsten bronze, pyrochlore, and a layer compound such as a bismuth layer compound in particular are applicable. Similar effects are achieved by integration of a single crystal piezoelectric material with an arbitrary non-excitation layer by using a joining, an adhesion, or other suitable technique.

Also, the materials of the excitation layer 14 and the non-excitation layer 16 may be the same or different. When the same material is used, since there is no difference in a thermal expansion rate, no internal stress is generated even when the temperature is changed, resulting in the highly reliable of the piezoelectric resonator. When they are different, correction of temperature characteristics of the resonance frequency and control of the Q value of the resonator are achieved. In such a manner, by properly selecting materials of the excitation layer 14 and the non-excitation layer 16, various characteristics are achieved. Furthermore, the non-excitation layer 16 may have or may not have piezoelectricity as long as it is not excited by the electric field applied to the piezoelectric resonator 10.

According to various preferred embodiments of the present invention, a piezoelectric resonator which achieves a compact oscillator with high performance having greatly increased thermal resistance and a very narrow tolerance is obtained.

In such a piezoelectric resonator, by providing a spurious response suppressing electrode, a piezoelectric resonator with a greatly reduced spurious response is obtained.

It should be understood that the foregoing description is only illustrative of preferred embodiments of the present invention. Various alternatives and modifications can be devised by those skilled in the art without departing from the present invention. Accordingly, the present invention is intended to embrace all such alternatives, modifications and variations which fall within the scope of the appended claims.

What is claimed is:

1. A piezoelectric resonator comprising:
   an element body;
   at least one pair of vibration electrodes including at least one internal electrode provided in said element body; and
   said element body including at least one excitation layer excited by an electric field to vibrate, and at least one non-excitation layer not excited to vibrate, the piezoelectric resonator exciting a longitudinal thickness mode harmonic of the n-th order, where n is an integer other than 1;
   wherein when the thickness of the element body is denoted by t and a unit layer thickness is represented by approximately t/n, the thickness of the at least one excitation layer is an integer multiple of the unit layer thickness, and the thickness of the at least one non-excitation layer is an integer multiple of the unit layer thickness;
   when the at least one internal electrode comprises an odd number of internal electrodes, at least one of the layers adjacent to an innermost internal electrode of the odd number of internal electrodes is the at least one non-excitation layer; and
   when the at least one internal electrode comprises an even number of internal electrodes, the layer located in an approximate center of the element body is the at least one non-excitation layer.

2. A piezoelectric resonator according to claim 1, wherein the unit layer thickness of the at least one excitation layer is in the range of about 0.7 t/n to about 1.2 t/n and the unit layer thickness of the at least one non-excitation layer is in the range of about 0.8 t/n to about 1.3 t/n.

3. A piezoelectric resonator according to claim 1, wherein the at least one pair of vibration electrodes are provided only on one principal plane of the at least one non-excitation layer.

4. A piezoelectric resonator according to claim 1 wherein the at least one pair of vibration electrodes have the same potential and are provided on both principal planes of the at least one non-excitation layer.

5. A piezoelectric resonator according to claim 1, wherein the at least one non-excitation layer is made of non-polarized piezoelectric ceramics or dielectric ceramics.

6. A piezoelectric resonator according to claim 1, further comprising:
a first and a second end surface electrode provided on the surface of the element body;
a spurious response suppressing electrode electrically connected to the first end surface electrode;
wherein the spurious response suppressing electrode is arranged to have a constant gap to one end of the vibration electrode connected to the second end surface at the other end in a direction that is substantially perpendicular to the depositing direction of the at least one excitation layer and the at least one non-excitation layer.

7. A piezoelectric resonator according to claim 6, wherein a ratio between the gap and the unit layer thickness is in the range of about 1.0 to about 3.0.

8. A piezoelectric resonator according to claim 6, wherein at least one of said vibration electrodes is provided on an exterior surface of the element body and connected to said first end face electrode, and at least one of said vibration electrodes is provided on an interior portion of said element body and connected to said second end surface electrode.

9. A piezoelectric resonator according to claim 6, wherein at least two of said vibration electrodes are disposed on opposite sides of one of said at least one non-excitation layer and connected to said first end-surface electrode such that an electric field is not applied to said one of said at least one non-excitation layer.

10. A piezoelectric resonator comprising:
an element body;
at least one pair of vibration electrodes including at least one internal electrode provided in said element body; and
said element body including at least one excitation layer excited by an electric field to vibrate, and at least one non-excitation laser not excited to vibrate; wherein
when the thickness of the element body is denoted by t and a unit layer thickness is represented by approximately t/n, where n is an integer other than 1, the thickness of the at least one excitation layer is an integer multiple of the unit layer thickness, and the thickness of the at least one non-excitation layer is an integer multiple of the unit layer thickness;
when the at least one internal electrode comprises an odd number of internal electrodes, at least one of the layers adjacent to an innermost internal electrode of the odd number of internal electrodes is the at least one non-excitation layer; and
when the at least one internal electrode comprises an even number of internal electrodes, the layer located in an approximate center of the element body is the at least one non-excitation layer.

11. A piezoelectric resonator according to claim 10, wherein one vibration electrode of said at least one pair of vibration electrodes is disposed on a surface of said at least one excitation layer, and another vibration electrode of said at least one pair of vibration electrodes is disposed between said at least one excitation layer and said at least one non-excitation layer.

12. A piezoelectric resonator according to claim 10, wherein the piezoelectric resonator excites a longitudinal thickness mode harmonic of the n-th order.

13. A piezoelectric resonator according to claim 10, wherein the unit layer thickness of the at least one excitation layer is in the range of about 0.7 t/n to about 1.2 t/n and the unit layer thickness of the non-excitation layer is in the range of about 0.8 t/n to about 1.3 t/n.

14. A piezoelectric resonator according to claim 10, wherein the at least one pair of vibration electrodes are provided only on one principal plane of the at least one non-excitation layer.

15. A piezoelectric resonator according to claim 10, wherein the at least one pair of vibration electrodes have the same potential and are provided on both principal planes of the at least one non-excitation layer.

16. A piezoelectric resonator according to claim 10, wherein the at least one non-excitatior. layer is made of non-polarized piezoelectric ceramics or dielectric ceramics.

17. A piezoelectric resonator according to claim 10, further comprising:
a first and a second end surface electrode provided on the surface of the element body;
a spurious response suppressing electrode electrically connected to the first end surface electrode;
wherein the spurious response suppressing electrode is provided to have a constant gap to one end of the vibration electrode connected to the second end-surface at the other end in a direction that is substantially perpendicular to the depositing direction of the at least one excitation layer and the at least one non-excitation layer.

18. A piezoelectric resonator according to claim 17, wherein a ratio between the gap and the unit layer thickness, i.e., gap/unit layer thickness, is in the range of about 1.0 to about 3.0.

19. A piezoelectric resonator according to claim 17, wherein at least one of said vibration electrodes is provided on an exterior surface of the element body and connected to said first end surface electrode, and at least one of said vibration electrodes is provided on an interior portion of said element body and connected to said second end surface electrode.

20. A piezoelectric resonator according to claim 17, wherein at least two of said vibration electrodes are disposed on opposite sides of one of said at least one non-excitation layer and connected to said first end-surface electrode such that an electric field is not applied to said one of said at least one non-excitation layer.

* * * * *